United States Patent
Kashima et al.

[11] Patent Number: 5,285,348
[45] Date of Patent: Feb. 8, 1994

[54] CIRCUIT ASSEMBLY FOR DOWN CONVERTER FOR SATELLITE COMMUNICATIONS

[75] Inventors: Yukiro Kashima, Takatsuki; Akihito Deki, Amagasaki; Hirotaka Fujisaki, Neyagawa, all of Japan

[73] Assignee: Matsushita Electric Industrial Co., Ltd., Osaka, Japan

[21] Appl. No.: 847,981
[22] PCT Filed: Sep. 2, 1991
[86] PCT No.: PCT/JP91/01170
§ 371 Date: Apr. 14, 1992
§ 102(e) Date: Apr. 14, 1992
[87] PCT Pub. No.: WO92/04780
PCT Pub. Date: Mar. 19, 1992

[30] Foreign Application Priority Data
Sep. 3, 1990 [JP] Japan .................. 2-233495

[51] Int. Cl.⁵ .............................. H05K 9/00
[52] U.S. Cl. ......................... 361/736; 174/35 R; 333/182; 361/302; 361/816; 439/607
[58] Field of Search .......... 361/302, 303, 395, 399, 361/412, 413, 424, 428; 333/182, 185, 248, 183; 174/35 R, 35 C, 35 GC; 257/532; 455/207, 306, 307, 311, 313, 323; 439/65, 95, 108, 607, 620

[56] References Cited
U.S. PATENT DOCUMENTS

| | | | |
|---|---|---|---|
| 3,818,349 | 6/1974 | Ma | 325/352 |
| 4,173,745 | 11/1979 | Saunders | 333/182 |
| 4,642,589 | 2/1987 | Chambers | 333/182 |
| 4,823,233 | 4/1989 | Brown | 361/383 |
| 4,894,753 | 1/1990 | Wadell | 361/424 |
| 4,908,738 | 3/1990 | Kobari | 361/429 |
| 4,912,604 | 3/1990 | Vaisanea | 361/424 |

FOREIGN PATENT DOCUMENTS 52-8163 1/1977 Japan .
59-74737 4/1984 Japan .

OTHER PUBLICATIONS
"Production Techniques", Guditz, Dec. 18, 1959, "Electronics" pp. 96–99.

Primary Examiner—Gerald P. Tolin
Attorney, Agent, or Firm—Stevens, Davis, Miller & Mosher

[57] ABSTRACT

A microminature down converter for satellite communications has a structure in which high frequency circuit printed boards (5) are respectively arranged on peripheral four surfaces of a box made of a die-casting and a power printed board (1) for supplying power to each of said high frequency circuit printed boards is disposed on a surface opposite to an input portion of a wave guide tube, whereby power supply to each of the high frequency circuit printed boards (5) is performed not through lead wires. Therefore, electromagnetic couplings occurring between printed boards are prevented and electromagnetic couplings between high frequency signals occurring in the printed boards and lead wires are also prevented, so that it is possible to restrain occurrence of undesired waves.

1 Claim, 2 Drawing Sheets

F I G. 2
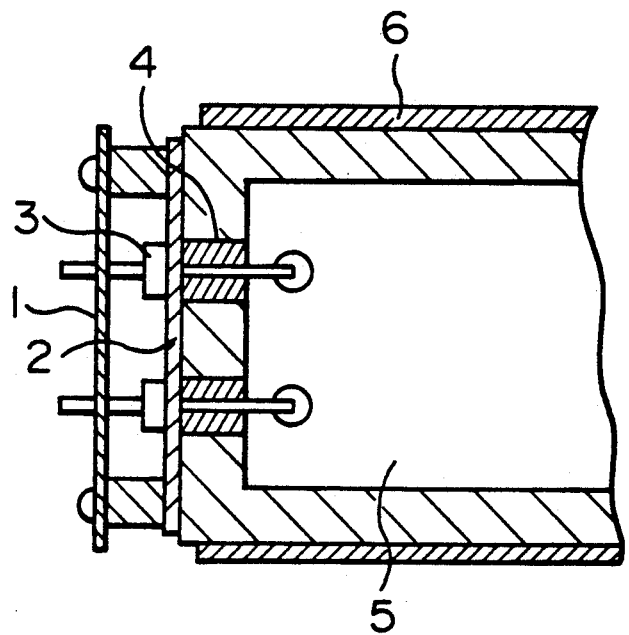

CIRCUIT ASSEMBLY FOR DOWN CONVERTER FOR SATELLITE COMMUNICATIONS

DESCRIPTION

MICROMINATURE DOWN CONVERTER FOR SATELLITE COMMUNICATIONS

1. Technical Field

The present invention relates to a microminature down converter for satellite communications which is used to receive satellite communications.

2. Background Art

Generally, in microminature down converters for satellite communications, high frequency circuit printed boards and power printed board for supplying power thereto are disposed at two or three peripheral surfaces of a box made of a die-casting and the power is supplied from the power printed board to each of the high frequency circuit printed boards through, mainly, lead wires.

However, the structure in which the power is supplied to each of the high frequency circuit printed boards through the lead wires as described above has a problem that the lead wires and high frequency signals occurring in the high frequency circuit printed boards electromagnetically couple with each other, whereby undesired waves appear in intermediate frequency outputs, which can be obtained after received input signals are frequency converted and it is very difficult to remove the undesired waves.

In view of such problem, the present invention has been accomplished and an object of the invention is to provide a superior microminature down converter for satellite communications which has a structure to supply power to each of high frequency circuit boards not through lead wires and in which occurrence of undesired waves is restrained.

DISCLOSURE OF INVENTION

A microminature down converter for satellite communications according to the invention is characterized in that high frequency circuit printed boards are disposed at peripheral four surfaces of a box made of a die-casting and a power printed board which supplies power to each of the high frequency circuit printed boards not through lead wires is disposed on a surface opposite to an input portion of a wave guide tube.

The microminature down converter of the invention has a structure in which the high frequency circuit printed boards are disposed at the peripheral four surfaces of the box made of a die-casting, so that electromagnetically couplings occurring between respective printed boards are prevented and further electromagnetically couplings between high frequency signals occurring in the respective printed boards and the lead wires is also prevented by the fact that the power to the respective printed boards is supplied not through lead wires, whereby it is possible to restrain occurrence of the undesired waves.

BRIEF DESCRIPTION OF DRAWINGS

FIG. 2 is a sectional view showing a mounting condition of the embodiment.

BEST MODE FOR CARRYING OUT THE INVENTION

Figure 1:
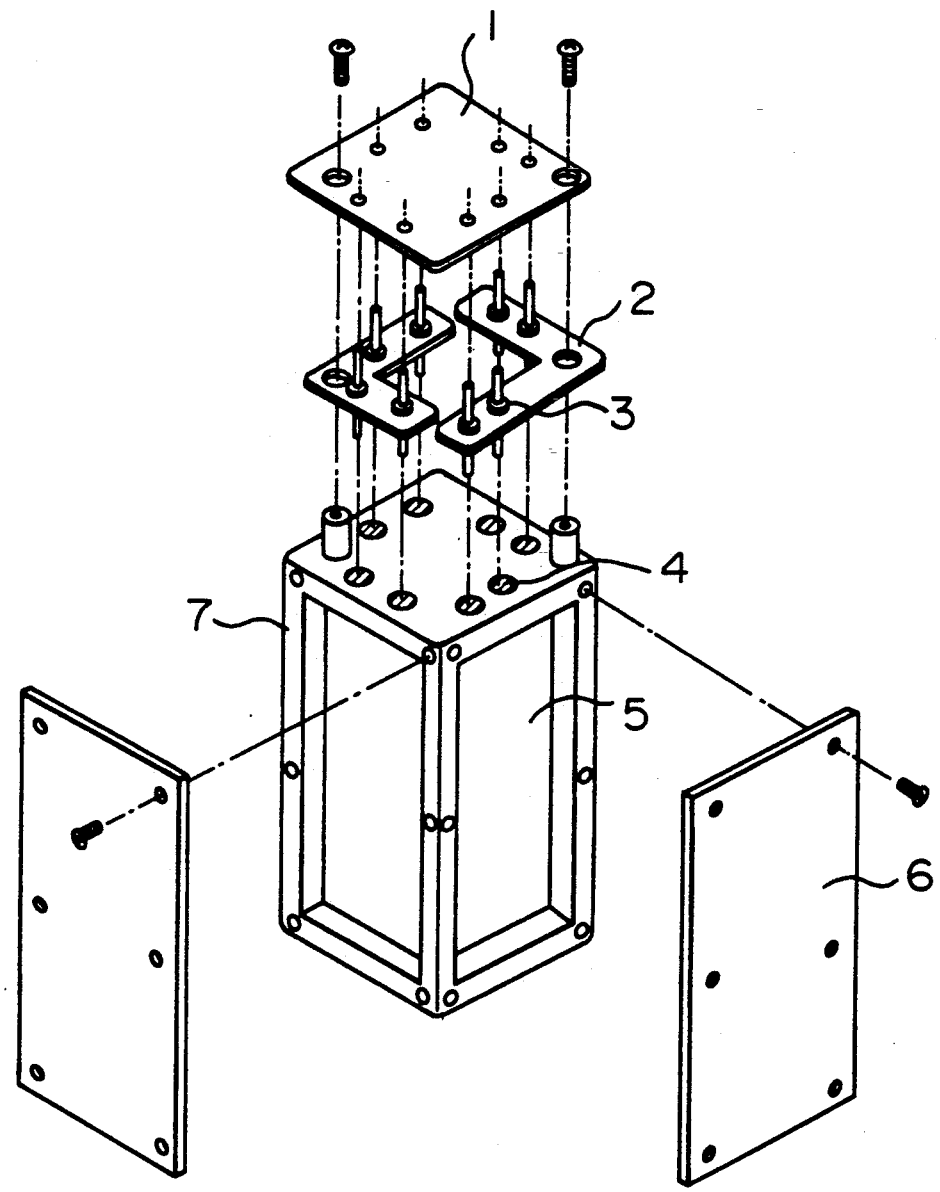
FIG. 1 is an exploded perspective view showing an embodiment of the invention.

Hereinafter, an embodiment of the invention will be described with reference to the accompanying drawings. FIG. 1 is an exploded perspective view showing an embodiment of the invention and FIG. 2 is a sectional view showing a mounting condition of the embodiment. In these drawings, the reference numeral 1 denotes a power printed board for supplying power, 2 denotes fixing plates which are used to fix feed-through capacitors, 3 denotes feed-through capacitors interconnecting the power printed board and high frequency circuit printed boards, 4 denotes holes, into which the feed-through capacitors are inserted, formed in a box made of a die-casting, 5 denotes the high frequency circuit printed boards and 6 denotes covers for the high frequency circuit printed boards to shield the high frequency circuit printed board.

In the embodiment, the high frequency circuit printed boards 5 receive power supply from the power printed board 1 through the feed-through capacitors 3 which are fixed on the box by the plates 2 for fixing the feed-through capacitors, without using any lead wires which are apt to cause electromagnetic coupling. Therefore, occurrence of undesired waves is restrained.

Further, electromagnetic coupling between the high frequency circuit printed board 5 and the other three high frequency circuit printed boards 5 respectively disposed on the other three surfaces is also prevented by threadedly fixing the covers 6 made of aluminum for high frequency circuit printed board on the box so as to cover respective high frequency circuit printed boards.

Further, in the above described embodiment, the feed-through capacitors are fixed on the box by using the plates for fixing the feed-through capacitors but the same advantages can be obtained even when screw fixing type feed-through capacitors which are directly fixable on the box are used without using the plates for fixing the feed-through capacitors.

INDUSTRIAL APPLICABILITY

As described hereinbefore, according to the invention, it is possible to restrain the undesired waves, which occur from the electromagnetic coupling, by the reason that the power printed board and the high frequency circuit printed boards are interconnected not through lead wires and the high frequency printed circuit boards are respectively arranged at the for peripheral surfaces of the box and covered by the covers made of aluminum. It is possible to say that the present invention is a very effective invention in practice.

We claim:

1. A circuit assembly for a down converter for satellite communications, said circuit assembly comprising:
   a box shaped housing;
   at least one first printed circuit board arranged on at least one first surface of said box shaped housing;
   a power printed circuit board arranged on a second surface of said box shaped housing;
   at least one feed-through capacitor fixed on said second surface of said box shaped housing and interconnecting said at least one first printed circuit board and said power printed circuit board to supply power from said power printed circuit board to said at least one first printed circuit board; and
   at least one fixing plate disposed on said second surface of said box shaped housing between said box shaped housing and said power printed circuit board, said at least one feed-through capacitor being mounted in said at least one fixing plate.

* * * * *